(12) United States Patent
Taniguchi et al.

(10) Patent No.: US 10,048,341 B2
(45) Date of Patent: Aug. 14, 2018

(54) MAGNETIC RESONANCE IMAGING APPARATUS AND METHOD FOR CALCULATING PULSE SEQUENCE TO BE CARRIED ON MAGNETIC RESONANCE IMAGING APPARATUS

(71) Applicant: Hitachi, Ltd., Tokyo (JP)

(72) Inventors: Yo Taniguchi, Tokyo (JP); Toru Shirai, Tokyo (JP); Suguru Yokosawa, Tokyo (JP); Hisaaki Ochi, Tokyo (JP); Shinji Kurokawa, Tokyo (JP); Hiroyuki Takeuchi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 707 days.

(21) Appl. No.: 14/615,494

(22) Filed: Feb. 6, 2015

(65) Prior Publication Data

US 2015/0293197 A1   Oct. 15, 2015

(30) Foreign Application Priority Data

Apr. 9, 2014 (JP) ................. 2014-080184

(51) Int. Cl.
   *G01V 3/00*     (2006.01)
   *G01R 33/54*    (2006.01)
   *G01R 33/385*   (2006.01)

(52) U.S. Cl.
   CPC ........ *G01R 33/543* (2013.01); *G01R 33/3854* (2013.01)

(58) Field of Classification Search
   CPC .............. G01R 33/543; G01R 33/5659; G01R 33/3415; G01R 33/36; A61B 5/055
   USPC ........................................................ 324/309
   See application file for complete search history.

(56) References Cited

U.S. PATENT DOCUMENTS

| 5,217,016 A | * | 6/1993 | Axel ................ G01R 33/56333 |
| | | | 324/309 |
| 6,541,971 B1 | * | 4/2003 | Dannels ............ G01R 33/4833 |
| | | | 324/307 |
| 2012/0187948 A1 | | 7/2012 | Yamashita et al. |

FOREIGN PATENT DOCUMENTS

| CN | 101339232 A | 1/2009 |
| CN | 102427763 A | 4/2012 |

OTHER PUBLICATIONS

Chinese Office Action received in corresponding Chinese Application No. 201510053821.6 dated Apr. 28, 2017.
F. Hennel et al., "Silent" MRI With Soft Gradient Pulses, pf Magnetic Resonance in Medicine 42, 1999, pp. 6-10.

(Continued)

*Primary Examiner* — Walter L Lindsay, Jr.
*Assistant Examiner* — Frederick Wenderoth
(74) *Attorney, Agent, or Firm* — Mattingly & Malur, PC

(57) ABSTRACT

When imaging is performed by executing a pulse sequence on an MRI apparatus, silencing is realized with securing sufficient application amount of crusher without extending the application time thereof. In the pulse sequence carried by the MRI apparatus, at least one gradient magnetic field pulse included in the pulse sequence has a waveform synthesized from two or more base waves shifting along the time axis direction (synthesized waveform), and the base waves have a smoothly changing waveform convex upward. The pulse of the synthesized waveform is generated from one or more trapezoidal or triangular base pulses by a waveform conversion part of a computer of the MRI apparatus or an external computer.

16 Claims, 17 Drawing Sheets

(56) References Cited

OTHER PUBLICATIONS

Franciszek Hennel, PhD, Fast Spin Echo and Fast Gradient Echo MRI With Low Acoustic Noise, Journal of Magnetic Resonance Imaging, 13, 2001, pp. 960-966.
Robert A. Hedeen et al., Characterization and Prediction of Gradient Acoustic Noise in MR Imagers, Magn Reson Med 37, 1997, pp. 7-10.

* cited by examiner

MAGNETIC RESONANCE IMAGING APPARATUS AND METHOD FOR CALCULATING PULSE SEQUENCE TO BE CARRIED ON MAGNETIC RESONANCE IMAGING APPARATUS

INCORPORATION BY REFERENCE

The present application claims priority from Japanese patent application JP-2014-80184 filed on Apr. 9, 2014, the content of which is hereby incorporated by reference into this application.

BACKGROUND OF THE INVENTION

Field of the Invention

The present invention relates to a magnetic resonance imaging apparatus, especially a technique for suppressing noises generated by a gradient magnetic field.

Description of the Related Art

Magnetic resonance imaging (MRI) apparatuses are medical diagnostic imaging apparatuses for medical use, which induce nuclear magnetic resonance in nuclei of hydrogen atoms in an arbitrary plane traversing a test subject, and produce a tomographic image of a region in the plane using generated nuclear magnetic resonance signals. In general, a slice gradient magnetic field for specifying imaging slice and an excitation pulse for exciting magnetizations in the plane are simultaneously applied, and nuclear magnetic resonance signals (echoes) generated in the course of the precession of the magnetizations excited by the pulses are obtained. In order to impart positional information to the magnetizations, a phase encoding gradient magnetic field and a readout gradient magnetic field are applied in directions perpendicular to each other in the tomographic plane in the process from the excitation to the acquisition of echoes.

The pulses for generating echoes and the gradient magnetic fields are applied according to a pulse sequence set beforehand. Various pulse sequences suitable for various purposes are known.

With such pulse sequences as mentioned above, application of the gradient magnetic field having a trapezoidal waveform is generally turned on and off at high speed, and therefore extremely loud noises of 80 to 100 dB are generated in the bore. Intensity of these noises is such an intensity that even a subject wearing a headphone, earplugs, or the like feel unpleasant in the bore. Moreover, intensity of such noises increases with use of a higher intensity of magnetic field, and therefore some countermeasure is required for apparatuses using high magnetic field intensity of 3 T (tesla) or higher.

As a technique for realizing silent apparatuses, there have been proposed techniques of changing the waveform of the gradient magnetic field (e.g., see "Characterization and Prediction of Gradient Acoustic Noise in MR Imagers", Hedeen R. A., Edelstein W. A., Magn. Reson. Med., 1997; 37:7-10, herein after referred to as "non-patent documents 1", and ""Silent" MRI With Soft Gradient Pulses", Hennel F., Girard F., Loenneker T., Magn. Reson. Med., 1999; 42:6-102, herein after referred to as "non-patent documents 2"). It is known that noises generated by a gradient magnetic field are generally represented by a product of a frequency response function (FRF) characteristic to each apparatus and frequency distribution of the gradient magnetic field waveform, and a frequency giving a smaller value of FRF provides a smaller intensity of the noises (see "Fast Spin Echo and Fast Gradient Echo MRI With Low Acoustic Noise", Hennel F., Magn. Reson. Med. 2001; 13:960-966, herein after referred to as "non-patent documents 3").

Non-patent document 1 discloses that FRF becomes extremely small with components of 200 Hz or smaller, and therefore if a low pass filter is used to suppress frequency components of the gradient magnetic field waveform of a frequency higher than the above frequency, the intensity of the noises can be made small. Specifically, for realizing a silent apparatus, Non-patent document 1 proposes to smooth the raising and falling portions of the trapezoidal waveform of the gradient magnetic field pulse by passing the pulse through a low pass filter.

Non-patent document 2 proposes use of gradient magnetic field pulses having a sine waveform for readout and phase encoding gradient magnetic field pulses.

In MRI, imaging conditions such as spatial resolving power and field of view are determined by time integral value of gradient magnetic field or intensity of the same in a partial section, and therefore silent apparatus must be realized so that such integral value and intensity should not change. In this respect, if a silent apparatus is realized by the method disclosed in Non-patent document 1, the waveform of the gradient magnetic field makes the application time longer, and thus the method has a problem that it cannot be applied to a fast pulse sequence, which scarcely gives time margin for interval of applications of gradient magnetic field pulses.

The technique described in Non-patent document 2 realizes a silent apparatus even with a fast pulse sequence by using sine waves for readout and phase encoding. However, the technique described in Non-patent document 2, which is intended to be used in the fast pulse sequence method, does not use sine wave for the slice gradient magnetic field pulse, or it is limited to 3D imaging, which does not need to use any slice gradient magnetic field. This is because if a sine wave is used for the slice gradient magnetic field pulse, the slice profile changes, and it becomes impossible to maintain sufficient application amount (time integral value of intensity) of crusher applied after the application of the slice gradient magnetic field.

Further, if a sine waveform is used for the readout gradient magnetic field pulse, the maximum intensity becomes large. Therefore, such use of sine waveform has a problem that sampling band becomes large, and therefore SN ratio decreases.

In addition to these problems, restrictions are imposed to degrade the degree of freedom for design of pulse sequence. For example, the echo time TE, which is one of the imaging conditions, cannot be arbitrarily set, since it depends on the repetition time TR, and application amount of crusher for the readout direction cannot be arbitrarily set, since it depends on the readout pulse.

SUMMARY OF THE INVENTION

The present invention was accomplished in view of the aforementioned problems of the conventional techniques, and an object of the present invention is to provide a technique for realizing a silent magnetic resonance imaging apparatus in which high degree of freedom for designing the pulse sequence is secured.

In order to achieve the aforementioned object, the MRI apparatus of the present invention uses a gradient magnetic field pulse of a synthesized waveform formed by synthesizing a plurality of base waves as the gradient magnetic field pulse.

That is, the MRI apparatus of the present invention comprises a static magnetic field magnet that generates a static magnetic field, a gradient coil that generates a gradient magnetic field in the static magnetic field generated by the static magnetic field magnet, a radio frequency coil that generates a radio (high) frequency magnetic field and detects a magnetic resonance signal, and a control part that drives the gradient coil and the radio frequency coil according to a predetermined pulse sequence, wherein at least one gradient magnetic field pulse included in the pulse sequence is a pulse having a waveform synthesized from two or more base waves shifting along the time axis direction (synthesized waveform), and the base waves have a smoothly changing waveform convex upward.

The MRI apparatus of the present invention is also an MRI apparatus comprising a static magnetic field magnet that generates a static magnetic field, a gradient coil that generates a gradient magnetic field in the static magnetic field generated by the static magnetic field magnet, a radio frequency coil that generates a radio frequency magnetic field and detects a magnetic resonance signal, a control part that drives the gradient coil and the radio frequency coil according to a predetermined pulse sequence, and a computer that calculates waveform of a gradient magnetic field pulse included in the pulse sequence, wherein the computer synthesizes by using a plurality of base waves having a smoothly changing waveform convex upward and shifting along the time axis direction to calculate a pulse having one synthesized waveform on the basis of a predetermined pulse shape depicted with a vertical axis indicating intensity and a horizontal axis indicating time.

The present invention also provides a method for calculating a pulse sequence to be carried on a magnetic resonance imaging apparatus, a program for making a computer execute this method, and a medium that records the program. This method for calculating a pulse sequence is a method comprising the step of calculating a first gradient magnetic field pulse having a smoothly changing waveform convex upward, on the basis of a predetermined pulse shape depicted with a vertical axis indicating intensity and a horizontal axis indicating time, for a slice selection gradient magnetic field pulse included in the pulse sequence, the step of calculating a radio frequency magnetic field pulse applied simultaneously with the first gradient magnetic field pulse, the step of judging whether specific absorption rate (SAR) of the calculated radio frequency magnetic field pulse is not higher than a threshold value or exceeds the threshold value, and the step of, when the specific absorption rate is not higher than the threshold value, setting the gradient magnetic field pulse as a slice gradient magnetic field pulse of the pulse sequence, or when the specific absorption rate exceeds the threshold value, calculating a second gradient magnetic field pulse having one synthesized waveform by synthesizing a plurality of base waves having a smoothly changing waveform convex upward and shifting along the time axis direction, on the basis of a predetermined pulse shape depicted with a vertical axis indicating intensity and a horizontal axis indicating time, and setting the second gradient magnetic field pulse as a slice gradient magnetic field pulse of the pulse sequence.

Effect of the Invention

Since the gradient magnetic field pulse employed in the MRI apparatus of the present invention is synthesized from base waves having a smoothly changing waveform convex upward, it has the same silencing effect as that of a sine wave or the like. Further, since it is a synthesized wave, time integral value and application time thereof can be made the same as those of a triangular or trapezoidal gradient magnetic field pulse, and the maximum value thereof can be made similar to that of a triangular or trapezoidal gradient magnetic field pulse. Therefore, a pulse sequence can be designed without affecting application time and other crusher gradient magnetic field pulses.

DESCRIPTION OF THE PREFERRED EMBODIMENTS

The MRI apparatus of the present invention comprises a static magnetic field magnet (101) that generates a static magnetic field, a gradient coil (102) that generates a gradient magnetic field in the static magnetic field generated by the static magnetic field magnet, a radio frequency coil (107) that generates a radio (high) frequency magnetic field and detects a magnetic resonance signal (henceforth referred to as RF coil), and a control part (104, 109) that drives the gradient coil and the RF coil according to a predetermined pulse sequence. At least one gradient magnetic field pulse included in the pulse sequence is a pulse having a waveform synthesized from two or more base waves shifting along the time axis direction (synthesized waveform), and the base waves have a smoothly changing waveform convex upward.

The base waves have, for example, a waveform represented by one cycle of a sign function, but having a single polarity due to offset of intensity, or a waveform represented by a Gaussian function. Further, the start point and end point of the application, and area (time integral value) of the gradient magnetic field pulse having a synthesized waveform are the same as those of the triangular or trapezoidal gradient magnetic field pulse, and intensity at the center thereof along the time direction is not higher than that of the triangular or trapezoidal gradient magnetic field pulse.

The control part has a function of changing parameters of the gradient magnetic field pulse of a synthesized waveform, such as code (plus or minus), intensity (maximum intensity), time of the start of application, time of the end of application, and application time (duration) (function of waveform conversion part).

At least one of the slice selection gradient magnetic field pulse, slice encoding gradient magnetic field pulse, phase encoding gradient magnetic field pulse (henceforth slice encoding gradient magnetic field and phase encoding gradient magnetic field are collectively referred to as encoding gradient magnetic field as required), and readout gradient magnetic field pulse is a gradient magnetic field pulse having a synthesized waveform. When the gradient magnetic field pulse having a synthesized waveform is the slice selection gradient magnetic field pulse, the radio frequency magnetic field pulse generated by the radio frequency coil is changed in accordance with the shape of the slice selection pulse (function of the radio frequency pulse generation part).

Hereafter, the MRI apparatus of the present invention and operation thereof will be explained with reference to the drawings.

Figure 1:
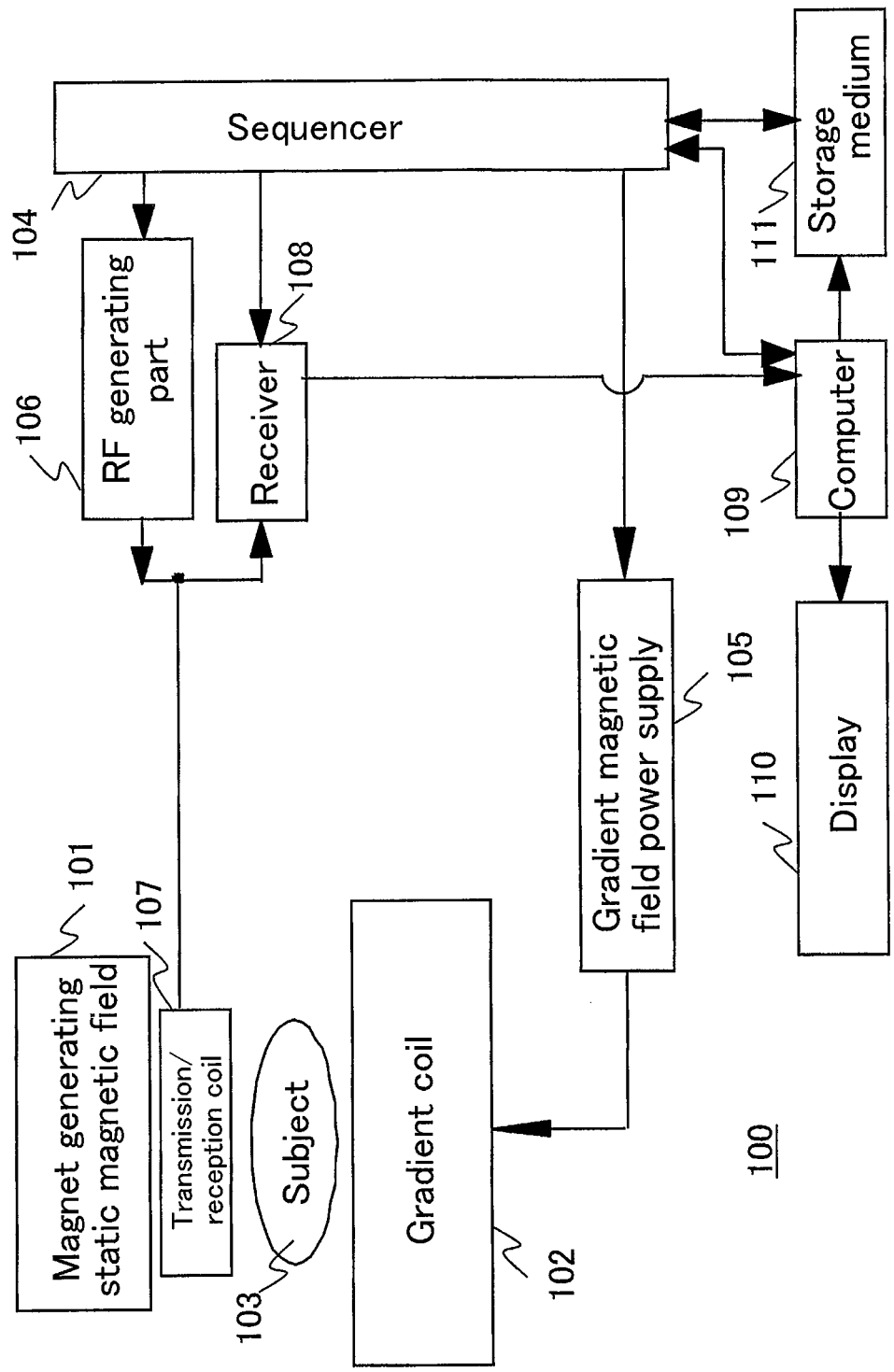
FIG. 1 is a block diagram showing total schematic of an MRI apparatus of the present invention.

First, the MRI apparatus of the present invention will be explained. FIG. 1 is a block diagram showing schematic configuration of an MRI apparatus 100 of the present invention. The MRI apparatus 100 comprises a magnet 101 that generates a static magnetic field, a gradient coil 102 that generates a gradient magnetic field, a sequencer 104, a gradient magnetic field power supply 105, an RF generating part 106, a transmission and reception coil 107 that irradiates a radio frequency magnetic field and detects NMR signals, a receiver 108, a computer 109, a display 110, and a storage medium 111. Although a single transmission and reception coil 107 is shown in the drawing, a transmission coil and a receiver coil may be separately provided.

A subject (for example, living body) 103 is placed on a bed (table) disposed in a static magnetic field space generated by the magnet 101. The sequencer 104 sends commands to the gradient magnetic field power supply 105 and the RF generating part 106 to make them generate a gradient magnetic field and a radio frequency magnetic field, respectively. The radio frequency magnetic field is applied to the subject 103 via the transmission and reception coil 107. NMR signals generated from the subject 103 are received by the transmission and reception coil 107, and detected by the receiver 108. A nuclear magnetic resonance frequency used as the basis of detection (detection reference frequency f0) is set by the sequencer 104. The detected signals are sent to the computer 109, and signal processings such as image reconstruction are performed there. The results are displayed on the display 110. The detected signals and measurement conditions may be stored in the storage medium 111 as required.

The sequencer 104 functions as a control part that controls the components so that they operate at timings and intensities programmed beforehand. Among programs, one describing timings of application of a radio frequency magnetic field and a gradient magnetic field, and reception of signals is especially called a pulse sequence (imaging sequence). In the MRI apparatus 100 of the present invention, an arbitrary pulse sequence can be used. A predetermined pulse sequence is chosen according to type of imaging, and executed to perform imaging.

Figure 2:
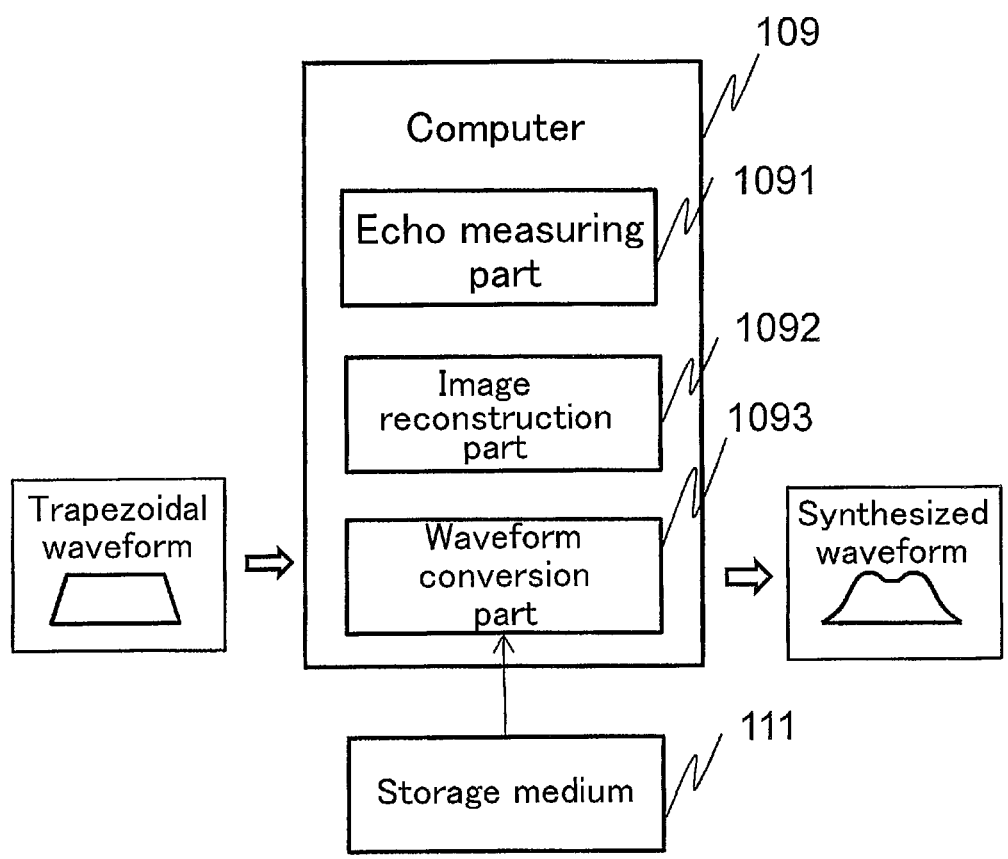
FIG. 2 is a drawing for explaining functions of the computer.

The computer 109 directs the sequencer 104 to measures NMR signals (echoes) according to a predetermined pulse sequence. As shown in FIG. 2, the computer comprises an echo measuring part 1091 that arranges measured echoes in a k-space, an image reconstruction part 1092 that reconstructs an image from the echoes arranged in the k-space, and a waveform conversion part (pulse sequence calculation part) 1093 that converts the waveform of the gradient magnetic field pulse.

The functions of the echo measuring part 1091 and the image reconstruction part 1092 are the same as those of conventional MRI apparatuses unless especially stated, and therefore explanations thereof are omitted. The waveform conversion part 1093 is a part characterizing the present invention, and converts a gradient magnetic field pulse set in the sequencer 104 as a default into a gradient magnetic field pulse having a waveform synthesized by using unipolar base waves showing smooth intensity change. The shape of the original gradient magnetic field pulse is usually a triangular or trapezoidal (rectangular) shape, and parameters thereof such as code (polarity), intensity (maximum intensity), time of the start of application, time of the end of application, and application time are usually read out from the storage medium 111 (or sequencer 104), and used.

The functions of the parts of the computer 109 are realized by CPU of the computer 109 through loading programs stored in the storage medium 111 on a memory, and executing them. The program for the waveform conversion part 1093 may be executed by a computer other than the computer 109, and a pulse sequence including the pulse of the obtained converted waveform may be stored in the storage medium 111.

Hereafter, embodiments of the present invention will be explained mainly for processing performed by the waveform conversion part 1093.

First Embodiment

This embodiment is an embodiment in which the present invention is applied to a 2D-SE (Spin Echo) sequence, and gradient magnetic field pulses of a synthesized waveform are used as a plurality of gradient magnetic field pulses included in the pulse sequence.

Figure 3:
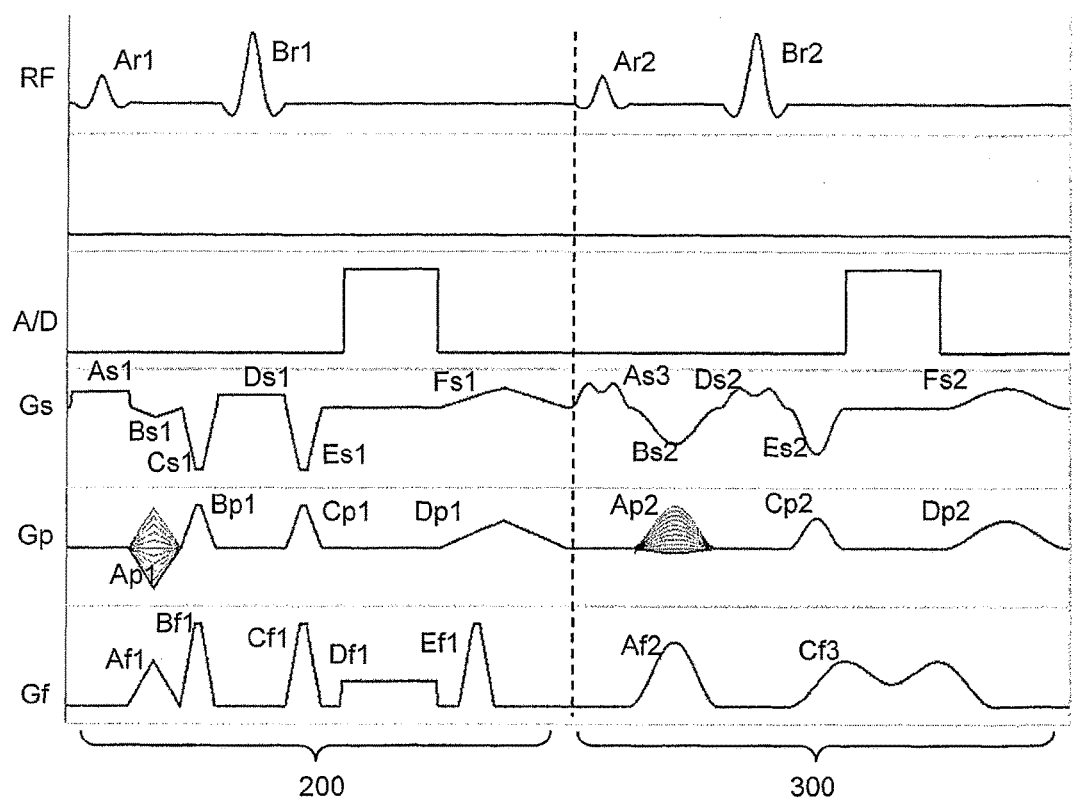
FIG. 3 is a drawing showing an example of the pulse sequence according to the first embodiment.

2D-SE sequences are shown in FIG. 3. In the drawing, a base 2D-SE sequence 200 is shown on the left side of the broken line, and a 2D-SE sequence 300 in which the gradient magnetic field pulses have been converted is shown on the right side of the broken line. In this drawing, RF, Gs, Gp, and Gf represent radio frequency magnetic field, slice gradient magnetic field, phase encoding gradient magnetic field, and readout gradient magnetic field, respectively. A/D represents sampling time of echo signal. The horizontal axis indicates time (the same shall apply to the following drawings of pulse sequences). The gradient magnetic field pulses of the base 2D-SE sequence are a trapezoidal wave or triangular wave.

With this base pulse sequence 200, a radio frequency magnetic field (RF) pulse Ar1 is first irradiated together with application of a slice selection gradient magnetic field pulse As1 to excite magnetization of a certain slice in the subject. Then, a slice rephasing gradient magnetic field pulse Bs1, a phase encoding gradient magnetic field pulse Ap1 for imparting positional information for the phase encoding direction to the phase of the magnetization, and a readout gradient magnetic field pulse Af1 for dephasing are applied. Further, crusher pulses Cs1, Bp1, and Bf1 for suppressing unnecessary signals are applied for each axis, then a refocusing pulse Br1 is irradiated together with a slice selection gradient magnetic field pulse Ds1, and crusher pulses Es1, Cp1, and Cf1 are applied again. Then, a magnetic resonance signal (echo) is measured at the sampling time with applying a readout gradient magnetic field pulse Df1 for imparting positional information for the readout direction, and crusher pulses Fs1, Dp1, and Ef1 are finally applied for the three axes. The time from the irradiation of the radio frequency magnetic field pulse Ar1 to the echo peak is called echo time TE.

The above procedure is repeated with a repetition time TR with changing intensity of the phase encoding gradient magnetic field pulse Ap1 (phase encoding amount) to measure echoes required for reconstruction of an image of the selected slice. By repeating the same measurement with changing the slice position, image data for a plurality of slices can be obtained. The slice position is changed by changing the frequency of the radio frequency magnetic field pulse.

In contrast to this base pulse sequence 200, the pulse sequence 300 shown in the right part includes the following changes, although the application timings of the pulses are the same. First, the slice selection gradient magnetic field pulses As1 and Ds1 are converted into gradient magnetic field pulses As3 and Ds2 as synthesized waves, respectively. Further, the readout gradient magnetic field Df1 and the two adjacent crusher pulses Cf1 and Ef1 are converted into a gradient magnetic field pulse Cf3 as one synthesized wave. The other gradient magnetic field pulses are converted independently or integrally with an adjacent gradient magnetic field pulse into a pulse having a unipolar waveform showing smooth increase and decrease of intensity. Further, although the difference is not clearly shown in the drawing, the waveforms of RF pulses Ar1 and Br1 are changed into those of Ar2 and Br2 in connection with the conversion of the slice selection gradient magnetic field pulses As1 and Ds1.

Figure 4:
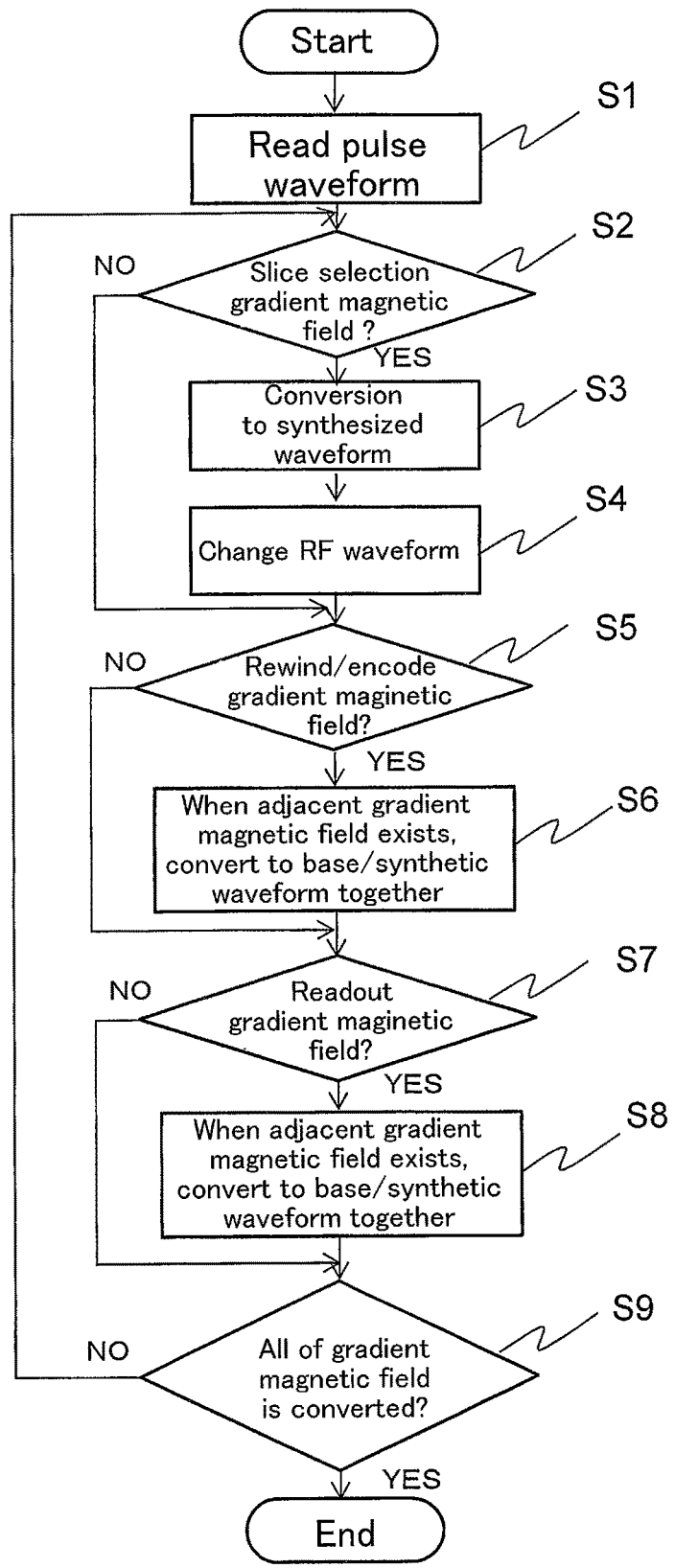
FIG. 4 is a drawing showing the flow of the waveform conversion processing according to the first embodiment.

The outline of the procedure of the processing for conversion of these waveforms is shown in FIG. 4.

A pulse sequence as an object of the processing is first read out, and parameters of the gradient magnetic field pulses (code, application amount, application time, time of the start of application, and time of the end of application) are read out (Step 1 (S1)). Then, they are converted into those of a synthesized waveform, for example, in the order of application of the gradient magnetic field pulses. In the example shown in the drawing, the waveform conversion of the slice gradient magnetic field pulses is performed first (S2, S3), then waveform conversion of the rewind gradient magnetic field and encoding gradient magnetic field pulses are performed (S5, S6), and waveform conversion of the readout gradient magnetic field pulses is performed (S7, S8), but the order of the conversions is not particularly limited.

If the waveform conversion process is performed for a slice gradient magnetic field pulse, the waveform of the RF pulse irradiated simultaneously with it is also changed (S4).

Further, for gradient magnetic field pulses other than the slice gradient magnetic field pulse, whether there is adjacently any gradient magnetic field pulse for the same axis or not is judged, and when there is a gradient magnetic field pulse for the same axis, one synthesized waveform is created for the combination of the adjacent gradient magnetic field pulses (S6, S8). The adjacent gradient magnetic field pulses mean gradient magnetic field pulses substantially continuously applied, between which any RF pulse is not applied.

The aforementioned processing is performed for all the gradient magnetic field pulses included in the objective pulse sequence to complete the waveform conversion processings (S9). Hereafter, the details of each processing will be explained.

<<Conversion of Slice Selection Gradient Magnetic Field Pulse>>

The waveform conversion part generate a slice selection gradient magnetic field pulse by synthesizing base waves having a smoothly changing waveform convex upward and shifting along the time axis direction. This operation is performed so that the code, application amount (time integral value), time of the start of application, time of the end of application of the generated slice selection gradient magnetic field pulse are substantially the same as those of the base slice selection gradient magnetic field pulse, and the intensity of the generated slice selection gradient magnetic field pulse at the time of the maximum intensity of the RF pulse (time of the peak position) is the same as or lower than that of the base slice selection gradient magnetic field pulse. The parameters of the base slice selection gradient magnetic field pulse (code, application amount (time integral value), time of the start of application, time of the end of application) are read out from a pulse sequence set beforehand in the sequencer 104 or the storage medium 111.

Figure 5:
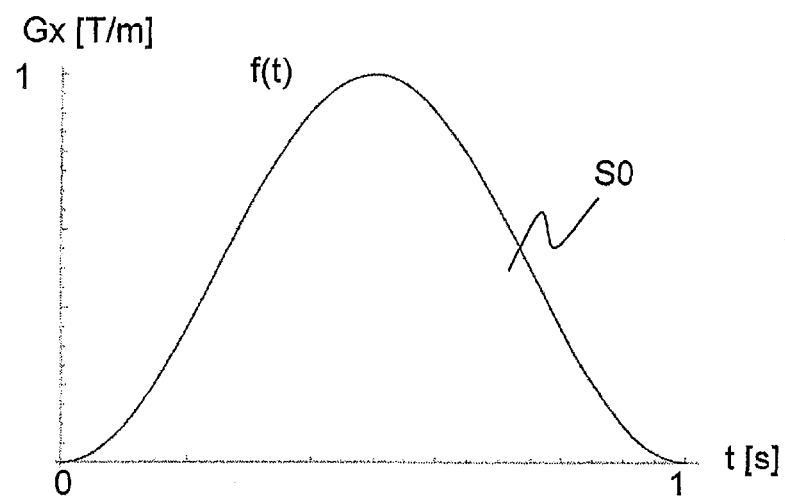
FIG. 5 is a drawing showing a base wave, wherein (a) shows a sine waveform and (b) shows a waveform represented by a Gaussian function.
Figure 5:
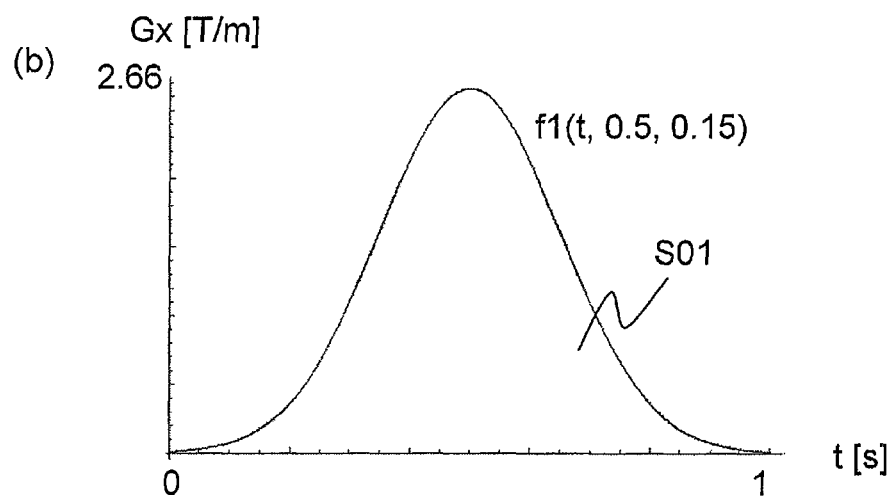

FIG. 5 shows examples of the base wave used for the synthesis. In FIG. 5, (a) shows a waveform represented by one cycle of a sign function and showing a single polarity due to offset of intensity, and it is represented by the following equation (1-1). The area (S0) of this base wave is represented by the equation (1-2). In the graph shown in the drawing, where the horizontal axis indicates time, and the vertical axis indicates gradient magnetic field intensity (relative value), the area $S_0$ corresponds to the application amount of a gradient magnetic field pulse of this waveform. When the maximum value of the gradient magnetic field intensity is 1, $S_0$ is 0.5.

[Equation 1]

$$f(t) = \begin{cases} 0.5\sin(2\pi t - \pi/2) + 0.5 & 0 \le t \le 1 \\ 0 & \text{else} \end{cases} \quad (1\text{-}1)$$

$$S_0 = \int_0^1 f(t)\,dt = 0.5 \quad (1\text{-}2)$$

FIG. 5 (b) shows a waveform represented by a Gaussian function, and it is represented by the following equation (2-1).

[Equation 2]

$$f_1(t, m, s) = \frac{e^{\frac{-m+t}{2s^2}}}{\sqrt{2\pi}s} \quad (2\text{-}1)$$

$$S_{01} = \int_0^1 f_1(t)\,dt = 1 \quad (2\text{-}2)$$

The equation (2-1) represents a normal distribution function, which is a kind of Gaussian function, and m and s in the equation represent average and standard deviation, respectively. FIG. 5 (b) represents a waveform represented by the equation (2-1) where m=0.5 and s=0.15, and the maximum value thereof is 2.66. The area ($S_{01}$) of this base wave is represented by the equation (2-2), and $S_{01}$ is 1.

The following explanation will be made with reference to an example where the base waves are sine waves.

Figure 6:
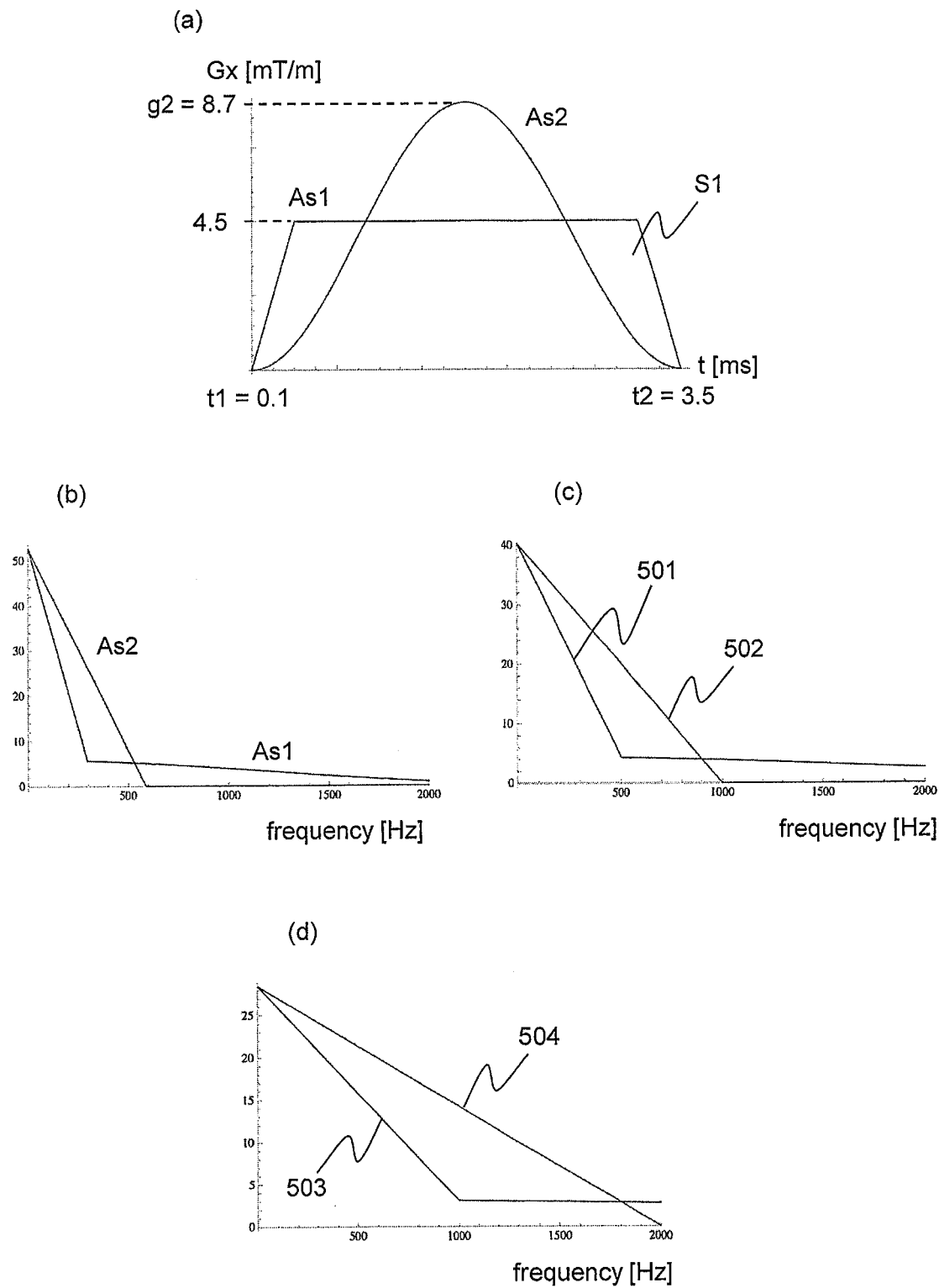
FIG. 6 is a drawing for explaining conversion from a trapezoidal waveform to a sine waveform, wherein (a) shows relation of a trapezoidal waveform and a sine waveform formed therefrom, (b) shows difference of frequency distributions of the trapezoidal wave and the sine wave, (c) shows difference of frequency distributions of the trapezoidal wave and the sine wave, and (d) shows difference of frequency distributions of the trapezoidal wave and the sine wave.

Here, propriety of use of only a single base wave is examined. FIG. 6 (a) shows a case where a gradient magnetic field pulse As2 as a sine wave is created from a trapezoidal gradient magnetic field pulse As1. This gradient magnetic field pulse (sine waveform pulse) As2 is described by the equation (3-1), and created so that the time of the start of application and time of the end of application thereof are substantially the same as those of the gradient magnetic field pulse As1, and area is the same as that of the gradient magnetic field pulse As1. The maximum intensity (peak intensity) g2 of the gradient magnetic field pulse As2 is represented by the equation (3-2). In the equation (3-2), S1 represents the area of the trapezoidal waveform.

[Equation 3]

$$f_A(t) = g_2 f((t-t_0)/(t_2-t_1)) \quad (3\text{-}1)$$

$$g_2 = S_1/((t_2-t_1)S_0) \quad (3\text{-}2)$$

For example, as for the slice selection gradient magnetic field pulse As1, intensity is 4.5 mT/m, times of the start and end of application are 0.1 ms and 3.5 ms, respectively, and application time is 3.4 ms. As for the RF pulse Ar1 simultaneously irradiated with the slice selection gradient magnetic field pulse As1, times of the start and end of application are 0.2 ms and 3.4 ms, and the application time thereof is substantially the same as that of the gradient magnetic field pulse As1. In this case, the peak intensity g2 of the sine waveform pulse is 8.7 mT/m.

If a gradient magnetic field pulse of a trapezoidal waveform is converted into that of a sine waveform of the same application time and the same time integral value as described above, the overall frequency distribution of the gradient magnetic field pulse moves to lower side. The frequency spectra of the pulses of both waveforms are shown in FIG. 6 (b). In the frequency spectrum of the trapezoidal pulse As1, the spectral value is high for frequencies of 300 Hz or smaller, and as for frequencies higher than that, components are widely distributed up to 2000 Hz. In contrast, in the frequency spectrum of the sine waveform pulse As2, there are only components of 500 Hz or smaller. Thus, if the pulse of a trapezoidal waveform is converted into that of a sine waveform, high frequency components are eliminated, and only low frequency components are remained. The noises generated by the gradient magnetic field can be thereby made smaller. The degree of the reduction of the noise level depends on the shape of FRF characteristic to each apparatus.

Further, in order to attain more accurate conversion of the pulse, the intensity of the pulse of sign waveform should be determined so that the area of the pulse of sign waveform should be the same as that of the pulse of trapezoidal waveform within the application time of the RF pulse of from 0.2 ms to 3.4 ms, and change of the slice profile caused by the conversion of the waveform can be thereby made smaller. In this case, the area of the trapezoidal waveform from the time 0.2 ms to 3.4 ms is 4.5×(3.4−0.2)=14.4 mT/m·s, and in order to obtain the same area of the sine waveform for this application time, the intensity g2 of the pulse of the sine waveform can be made to be 8.5. This value of g2 is almost the same as 98% of the value of g2 shown in FIG. 6 (a), 8.7, but the conversion of the waveform becomes more accurate.

FIG. 6 (b) shows difference of frequency distribution in the case where the application time of the trapezoidal wave is about 3 ms as shown in FIG. 6 (a). It can be seen that, in this case, by the conversion of the waveform into a sine waveform, the frequency components are limited to those of about 500 Hz or smaller, and therefore there is obtained an effect of reducing sound pressure level.

However, when the application time is shorter, even if the waveform is converted into a sine waveform, frequency components are distributed to several kilohertz, and thus the effect of reducing sound pressure level becomes weaker. Degree thereof depends on the shape of FRF. For example, when the application time of a trapezoidal wave is 2 ms (501), even if it is converted into a sine wave, the frequency components are distributed to 1000 Hz as indicated with the line 502 as shown in FIG. 6 (c), and thus the effect cannot be obtained in such a degree as obtained in the case where the application time is 3 ms. Further, when the application time is shorter than that of the above case, for example, 1 ms, components of 1 kHz or higher significantly increase in the sine wave (504) compared with those of a trapezoidal wave (503) as shown in FIG. 6 (d), and therefore conversion of a trapezoidal wave into a sine wave may highly possibly provide higher sound pressure level, rather than smaller sound pressure level. Therefore, although it depends on the shape of FRF, when the application time is about 2 ms or shorter, it is more possible that lower sound pressure level is provided with no conversion of the waveform into a sine waveform. Therefore, when there is not obtained the effect of reducing the sound pressure level due to the application time of the basic trapezoidal waveform, i.e., when the application time is, for example, about 2 ms or shorter, although it depends on the shape of FRF of the MRI apparatus, the conversion into a sine waveform may not be performed.

If the peak intensities of the gradient magnetic field pulse As1 and the pulse As2 of the sine waveform are compared, the peak intensity g2 of the pulse As2 of the sine waveform (8.7 mT/m) is 1.9 times of the peak intensity of the gradient magnetic field pulse As1 in the example mentioned above. If the maximum value of the gradient magnetic field pulse intensity becomes larger compared with that of the original trapezoidal wave pulse as in the case mentioned above, the intensity of the peak of the radio frequency magnetic field pulse also becomes large, and SAR becomes large. Therefore, when SAR exceeds a predetermined threshold value (value within acceptable range), a synthesized sine waveform formed by combining a plurality of base waveforms is used to suppress the maximum value of the gradient magnetic field pulse intensity and thereby prevent elevation of the peak intensity of the radio frequency magnetic field pulse. When SAR is not higher than the threshold value, a pulse consisting of a single sine wave may be used for a gradient magnetic field of which application time allows the effect of reducing the sound pressure level with a sine waveform as described above.

Figure 7:
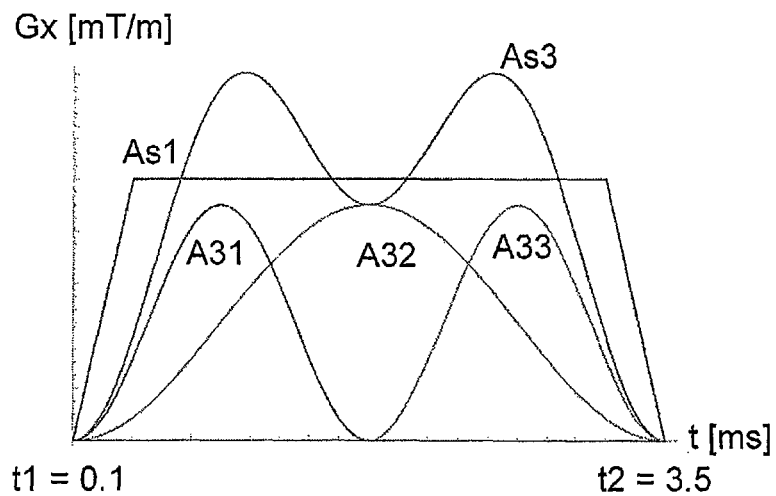
FIG. 7 is a drawing showing an example of waveform of a gradient magnetic field pulse synthesized from a plurality of sine waves.

An example of synthesized sine wave is shown in FIG. 7 and as the following equation (4-1). In the example shown in the drawing, a waveform of a gradient magnetic field pulse As3 is formed by synthesizing three base waves A31, A32, and A33. The waveform of As3 is a synthesized sine waveform formed by adding total three sine waveforms, i.e., one sine waveform (A32), which is represented by the equation (4-3), and of which cycle is 1 time of the application time, and two sine waveforms (A31 and A33), which are represented by the equations (4-2) and (4-4), and of which cycles are ½ time of the application time. The initial phases of A32 and A31 are 0, and the initial phase of A33 is ½ of the application time. Further, as shown by the equation (4-5), the waves A31, A32, and A33 have the same intensities g31, g32, and g33, and the values thereof are determined to be 0.5 so that the area of the synthesized waveform As3 is the same as the area of the original gradient magnetic field pulse As1.

[Equation 4]

$$f_{As3} = f_{A31}(t) + f_{A32}(t) + f_{A33}(t) \quad (4\text{-}1)$$

$$f_{A31}(t) = g_{31} f_A(2t) \quad (4\text{-}2)$$

$$f_{A32}(t) = g_{32} f_A(t) \quad (4\text{-}3)$$

$$f_{A33}(t) g_{33} f_A(2(t-(t_2-t_1)/2)) \quad (4\text{-}4)$$

$$g_{31} = g_{32} = g_{33} = 0.5 \quad (4\text{-}5)$$

Since the pulse As3 of the synthesized waveform contains only a component of A31, A33 and a component of A32 as frequency components, it does not contain high frequency components, and contain only low frequency components, as in the case of a pulse consisting a single sine wave, and thus it provides the silencing effect. Further, the gradient magnetic field intensity at the time t=1.8 ms, which corresponds to the peak position of the RF waveform, is the same as the peak intensity g32 of the wave A32, and is smaller than the intensity of the original trapezoidal wave. Therefore, there is not caused increase in SAR by waveform conversion.

Figure 8:
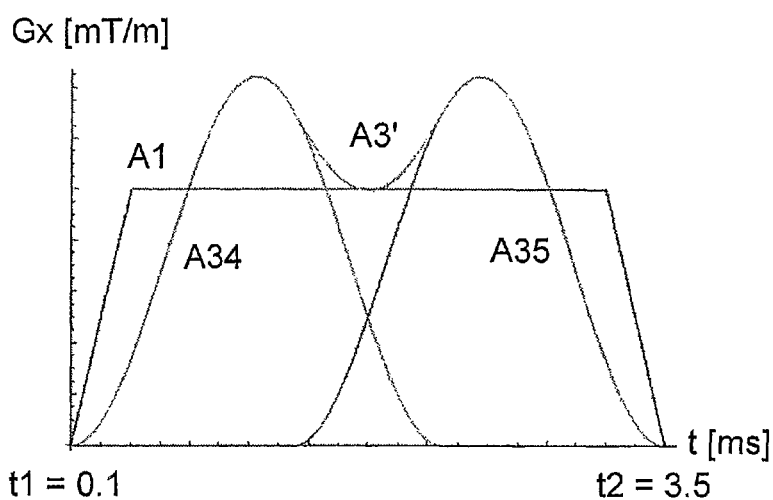
FIG. 8 is a drawing showing another example of waveform of a gradient magnetic field pulse synthesized from a plurality of sine waves.

Another example of synthesized sine wave is shown in FIG. 8 and as the equation (5-1). In the example shown in the drawing, a gradient magnetic field pulse wave A3' is formed by synthesizing two base waves A34 and A35 having the same shapes represented by the equation (5-2) and the equation (5-3), which shift along the time axis direction so that parts thereof overlap with each other. In the equations (5-2) and (5-3), g34 and g35 are intensities of the waves A34 and A35, and a1 is a variable for adjusting the cycles and initial phases of the waves A34 and A35. In the example shown in FIG. 8, g34 and g35 are 0.8 (equation (5-4)), and a1 is 1.6 (equation (5-5)).

[Equation 5]

$$f_{A3'}(t) = f_{A34}(t) f_{A35}(t) \quad (5\text{-}1)$$

$$f_{A34}(t) = g_{34} f(a_1 t) \quad (5\text{-}2)$$

$$f_{A35}(t) = g_{35} f(a_1(t-(1-1/a_1))) \quad (5\text{-}3)$$

$$g_{34} = g_{35} = 0.8 \quad (5\text{-}4)$$

$$a_1 = 1.6 \quad (5\text{-}5)$$

The gradient magnetic field intensity of this synthesized sine wave A3' is substantially the same as that of the original trapezoidal wave at the center position for the time axis direction. That is, if the synthesized sine wave A3' is used as the slice selection gradient magnetic field pulse As3 (FIG. 3), the intensity at the time of the peak position of the RF pulse Ar1 is the same as or smaller than that of the original trapezoidal wave, and therefore there can be obtained a pulse sequence not providing increase in SAR, as the pulse sequence including the pulse As3 of a synthesized sine waveform.

Conversion of the slice selection gradient magnetic field pulse As1 to be applied simultaneously with the excitation RF pulse Ar1 shown in FIG. 3 into a gradient magnetic field pulse of a synthesized waveform has been explained above. The slice selection gradient magnetic field pulse Ds1 to be applied with the refocusing pulse Br1 is also converted in a similar manner into a gradient magnetic field pulse Ds2 having a synthesized waveform.

<<Conversion of RF Pulse Waveform>>

In connection with the conversion of the slice gradient magnetic field pulses As1 and Ds1 mentioned above into the gradient magnetic field pulses As2 and Ds2 of a synthesized waveform, the waveforms of the RF pulses Ar1 and Br1, which are irradiated together with As2 and Ds2, are changed. The RF pulse waveforms to be changed corresponding to the gradient magnetic field waveforms can be calculated by using, for example, the small tip angle approximation method.

Figure 9:
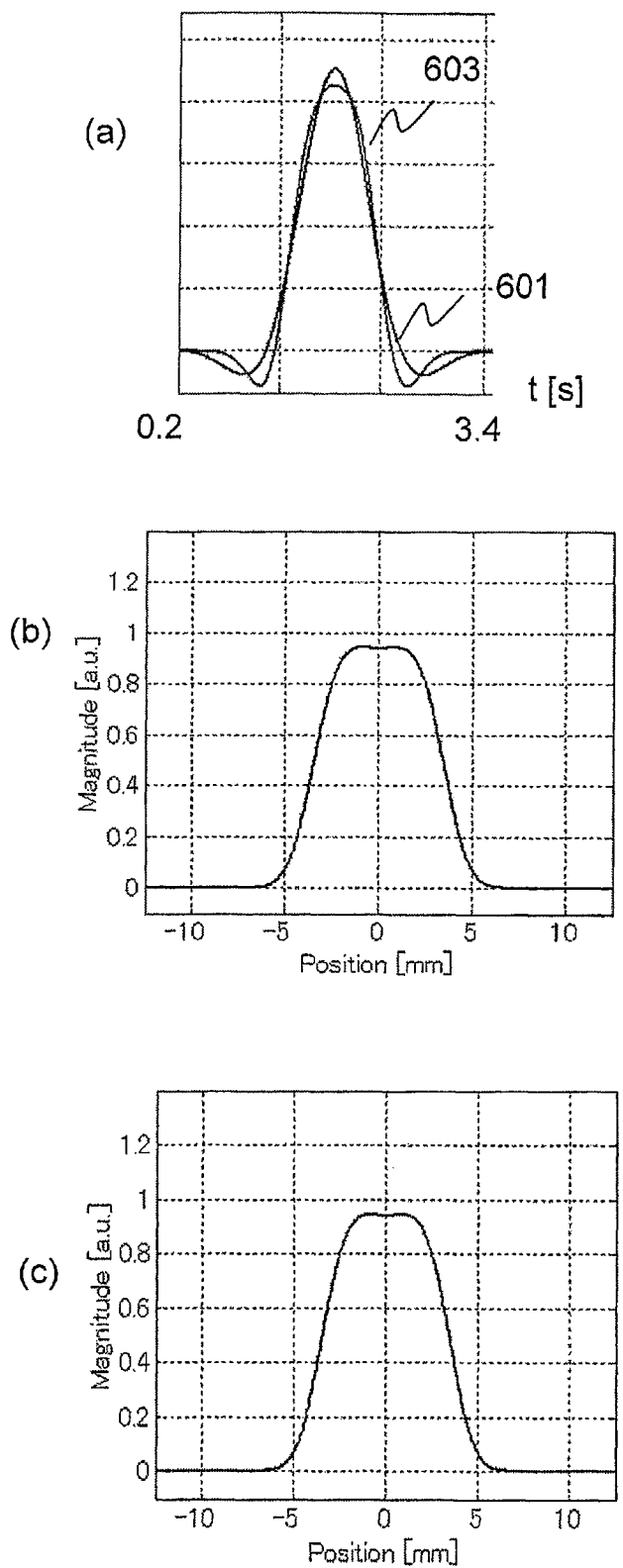
FIG. 9 is a drawing for explaining conversion of the RF pulse waveform in the case of using the slice selection gradient magnetic field pulse of a sine wave shown in FIG. 7, wherein (a) shows conversion of the RF pulse waveform, (b) shows the profile after the conversion, and (c) shows the profile before the conversion.

The waveform of an RF pulse 603 changed so as to correspond to the slice gradient magnetic field pulse As3 (synthesized waveform) shown in FIG. 7 and the slice profile thereof are shown in FIGS. 9 (a) and (b). In this example, the original RF pulse 601 has a waveform represented by a sinc function. The changed RF pulse $b_{As3}$ can be calculated according to the equation (6).

[Equation 6]

$$b_{As3}(t) = b_{As1}(\tau(t)) f_{As3}(t) / f_{As1}(t) \quad (6\text{-}1)$$

$$\tau(t) = \int_0^t f_{As3}(t) / f_{As1}(t) dt \quad (6\text{-}2)$$

In the equation, $b_{As1}$ represents the original RF pulse, $g_{As1}$ and $g_{As2}$ represent gradient magnetic field intensities of the pulses indicated by the subscripts, respectively, and $\tau$ is a function called time extension function. The slice profile of the original RF pulse 601 is shown in FIG. 9(c) for reference. As shown in the drawing, it can be seen that the peak intensity of the converted RF pulse waveform 603 is substantially the same as that of the original RF pulse waveform 601, and intensities of other positions are also equivalent to those at corresponding positions of the original pulse. Therefore, SAR of the converted pulse waveform is substantially the same as that of the original waveform. Further, it can also be confirmed that the slice profile shown in FIG. 9 (b) is hardly changed from that shown in FIG. 9 (c). As described above, by using a synthesized sine waveform in which the gradient magnetic field intensity at the peak time of the RF waveform is smaller than the original gradient magnetic field intensity, a peak intensity equivalent to that of the original RF pulse waveform can be maintained, and a gradient magnetic field pulse to be applied at the time of RF irradiation can be converted into a pulse of a sine waveform without increasing SAR. In general, if intensity of a gradient magnetic field pulse is not changed, peak intensity of an RF pulse waveform hardly changes. Therefore, it can be seen that it is sufficient to make the intensity of the synthesized sine waveform at the peak time of the RF waveform be substantially the same as or smaller than that of the original gradient magnetic field waveform.

Figure 10:
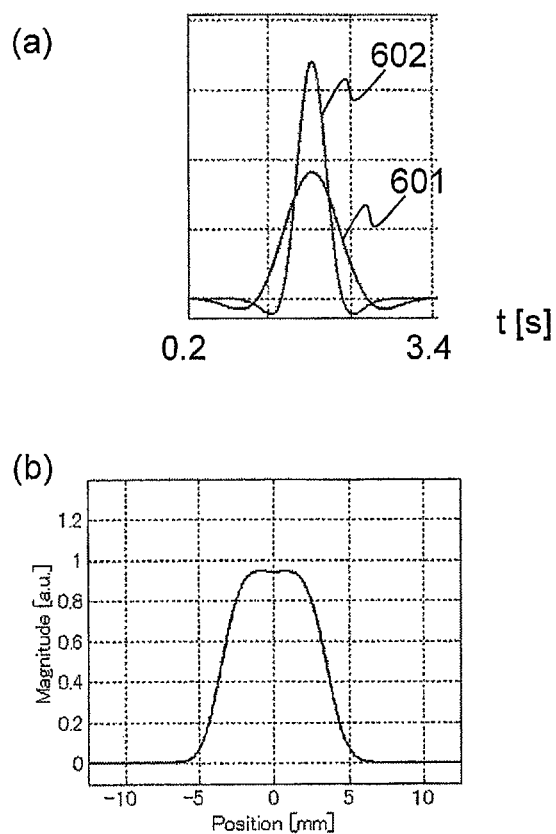
FIG. 10 is a drawing for explaining conversion of the RF pulse waveform in the case of using the slice selection gradient magnetic field pulse consisting of a single sine waveform, wherein (a) shows conversion of the RF pulse waveform and (b) shows the profile after the conversion.

In FIGS. 10, (a) and (b) show transformation of an RF pulse 601 in the case of using a gradient magnetic field pulse consisting of a single sine wave As2 shown in FIG. 6A, not a synthesized waveform, as a slice selection gradient magnetic field pulse, and slice profile thereof. Also in this example, the original RF pulse 601 is represented by a sinc function. When a single sine wave is used, the slice profile does not substantially change as shown in FIG. 10 (b), but the peak intensity of the transformed RF waveform 602 is larger than that of the original RF pulse 601. In this case, SAR becomes 1.9 times of that provided by the original waveform, and it may exceed the level acceptable for human bodies.

An example of the flow of the waveform conversion processing for slice gradient magnetic field pulse described above is shown in FIG. 11. It is first judged whether waveform conversion is carried out or not on the basis of application time of an objective slice gradient magnetic field pulse (S11). When the waveform conversion is not performed, the original trapezoidal gradient magnetic field pulse is used (S12). When it is judged that waveform conversion provides the silencing effect, a sine wave of which application time and application amount (time integral value) are the same as those of the slice gradient magnetic field pulse is prepared first (S13), and SAR provided thereby is evaluated. When SAR is not higher than an acceptable value (or threshold value set beforehand) (S14), the sine wave is used for the gradient magnetic field pulse (S15). When it is judged that SAR exceeds the acceptable value (threshold value) in S14, a synthesized waveform is calculated (S16), and the synthesized waveform is set as the gradient magnetic field pulse (S17). Waveform of RF pulse to be simultaneously irradiated with the set gradient magnetic field pulse is changed (S18). S11 to S18 are repeated for all the slice selection gradient magnetic field pulses (S19).

<<Conversion of Waveforms of Other Gradient Magnetic Field Pulses>>

As also for gradient magnetic field pulses other than the slice selection gradient magnetic field pulse, in the same manner as that used for the case slice selection gradient magnetic field pulse, base wave or waves are selected first (FIGS. 5, (a) and (b)), and a gradient magnetic field pulse having the same waveform as that of the base wave or a synthesized waveform synthesized from the base waves is prepared by using those base waves.

Figure 12:
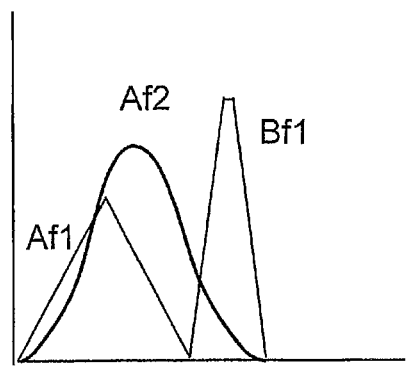
FIG. 12 is a drawing for explaining conversion of two adjacent gradient magnetic field pulses into one gradient magnetic field pulse of a sine waveform.

However, in the case of gradient magnetic field pulses other than the slice selection gradient magnetic field pulse, when there is an adjacent gradient magnetic field pulse, they are combined together to prepare a gradient magnetic field pulse of the same application time and application amount. High silencing effect is thereby obtained. For example, the readout gradient magnetic field pulse Af1 for dephasing and the crusher gradient magnetic field pulse Bf1 included in the pulse sequence shown in FIG. 3 are adjacent to each other, and no RF pulse is applied during the application thereof. These gradient magnetic field pulses Af1 and Bf1 can be applied as one pulse. FIG. 12 shows a gradient magnetic field pulse Af2 of a sine waveform, of which application time and application amount are the same as those of the gradient magnetic field pulses Af1 and Bf1. Since the dephasing gradient magnetic field pulse and crusher gradient magnetic field pulse are free from the problem of SAR or the problem of degradation of SN ratio at the time of readout, not a synthesized waveform synthesized from base waves, but a sine waveform can be used for them.

<<Conversion of Readout Gradient Magnetic Field Pulse>>

As also for readout gradient magnetic field pulse, adjacent gradient magnetic field pulses are combined together and thereby converted into one gradient magnetic field pulse in view of silencing. For example, the crusher pulse Cf1, readout gradient magnetic field pulse Df1, and crusher pulse Ef1 included in the pulse sequence shown in FIG. 3 are combined together to prepare a sine wave pulse or synthesized wave pulse of which application time and application amount are the same as those of the original pulses.

Figure 13:
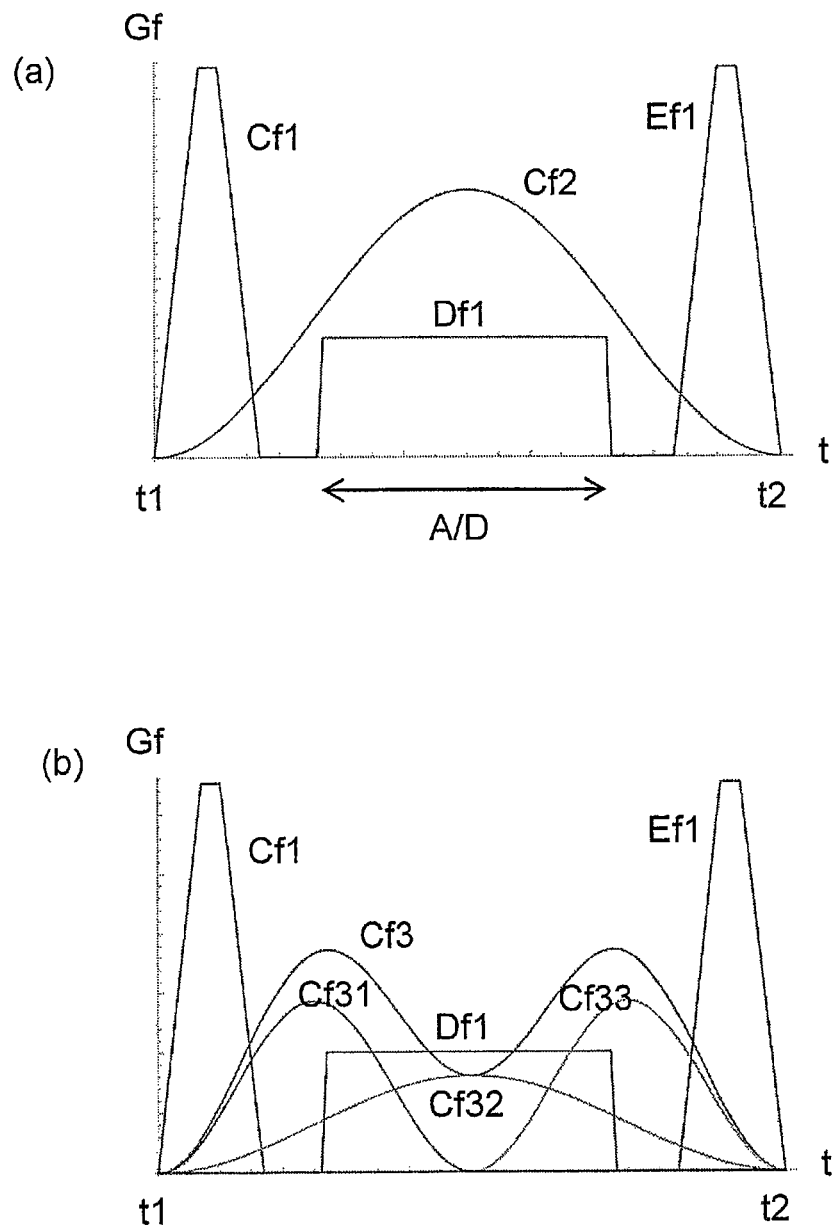
FIG. 13 is a drawing for explaining conversion of three adjacent gradient magnetic field pulses into one gradient magnetic field pulse, wherein (a) shows conversion into one gradient magnetic field pulse of a sine waveform and (b) shows conversion into a gradient magnetic field pulse of a synthesized waveform.

In FIG. 13, (a) shows a sine wave Cf2, which substitutes for the aforementioned three gradient magnetic field pulses of the readout direction, and (b) shows a synthesized wave Cf3 converted from the aforementioned pulses. The synthesized wave Cf3 is a wave formed by synthesizing three base waves Cf31, Cf32, and Cf33. These three base waves consist of the base wave Cf32 of a sine waveform, of which cycle is 1 time of the application time, and the base waves Cf31 and Cf33 of a sine waveform, of which cycle is ½ of the application time. A synthesized waveform Cf3 is synthesized from the sine wave Cf31 and Cf33, which are shifted in the time axis direction so as not to overlap with each other, and a sine waveform Cf32. Intensities of g31, g32, and g33 of the base waves are determined so that the area of Cf3 of the synthesized waveform is the same as the total of the areas of the crusher pulse Cf1, readout gradient magnetic field pulse Df1, and crusher pulse Ef1. In the example shown in the drawing, g31 and g33 are 0.8, and g32 is 0.4. However, values of g31, g32, and g33 may be arbitrarily determined, and g31 and g33 may not necessarily be the same.

The maximum intensity of Cf2 of the sine waveform shown in FIG. 13 (a) as a readout gradient magnetic field pulse applied during A/D is significantly higher than the maximum intensity of the original readout gradient magnetic field pulse Df1, i.e., 2.2 times of that of Df1. The sampling band becomes larger in proportion to the intensity of readout gradient magnetic field pulse, and it becomes almost twice larger in this case. S/N ratio decreases in proportion to the square root of the band, and therefore, when the pulse Cf2 of the sine waveform is used, the S/N ratio decreases to about 1/1.4.

In contrast, if the synthesized sine waveform Cf3 shown in FIG. 13 (b) is used, the average intensity during the period of A/D is only slightly larger than that of the original readout gradient magnetic field pulse Df1, and therefore decrease of the S/N ratio is suppressed.

Figure 14:
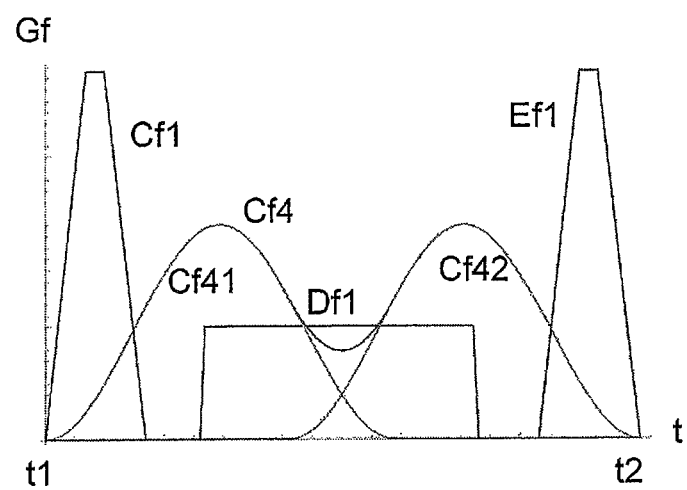
FIG. 14 is a drawing showing another example of conversion of three adjacent gradient magnetic field pulses into a pulse of a synthesized waveform.

The number of sine waveforms required for creating synthesized sine waveform is not limited to three. FIG. 14 shows an example of a synthesized sine waveform Cf4 created by combining two sine waveforms Cf41 and Cf42, as in the case of the synthesized wave shown in FIG. 8 (equation (5-1)). Also in this case, the area of the synthesized sine waveform Cf4 is determined so as to be the same as the total of the areas of the crusher pulse Cf1, readout gradient magnetic field pulse Df1, and crusher pulse Ef1. Further, intensities g34 and g35 of the base waves are set to be 1.1, and a1 is set be 1.7, so that the gradient magnetic field intensity during A/D becomes substantially the same as that of the original trapezoidal wave. However, intensities g34 and g35 may be arbitrarily determined, and they may not necessarily be the same. It can be seen that substantially the same waveform as the synthesized sine waveform of Cf3 synthesized from three sine waves is obtained for the synthesized sine waveform of Cf4. Therefore, an image showing substantially no decrease of S/N ratio can be obtained even with Cf4, as in the case of using Cf3.

Figure 11:
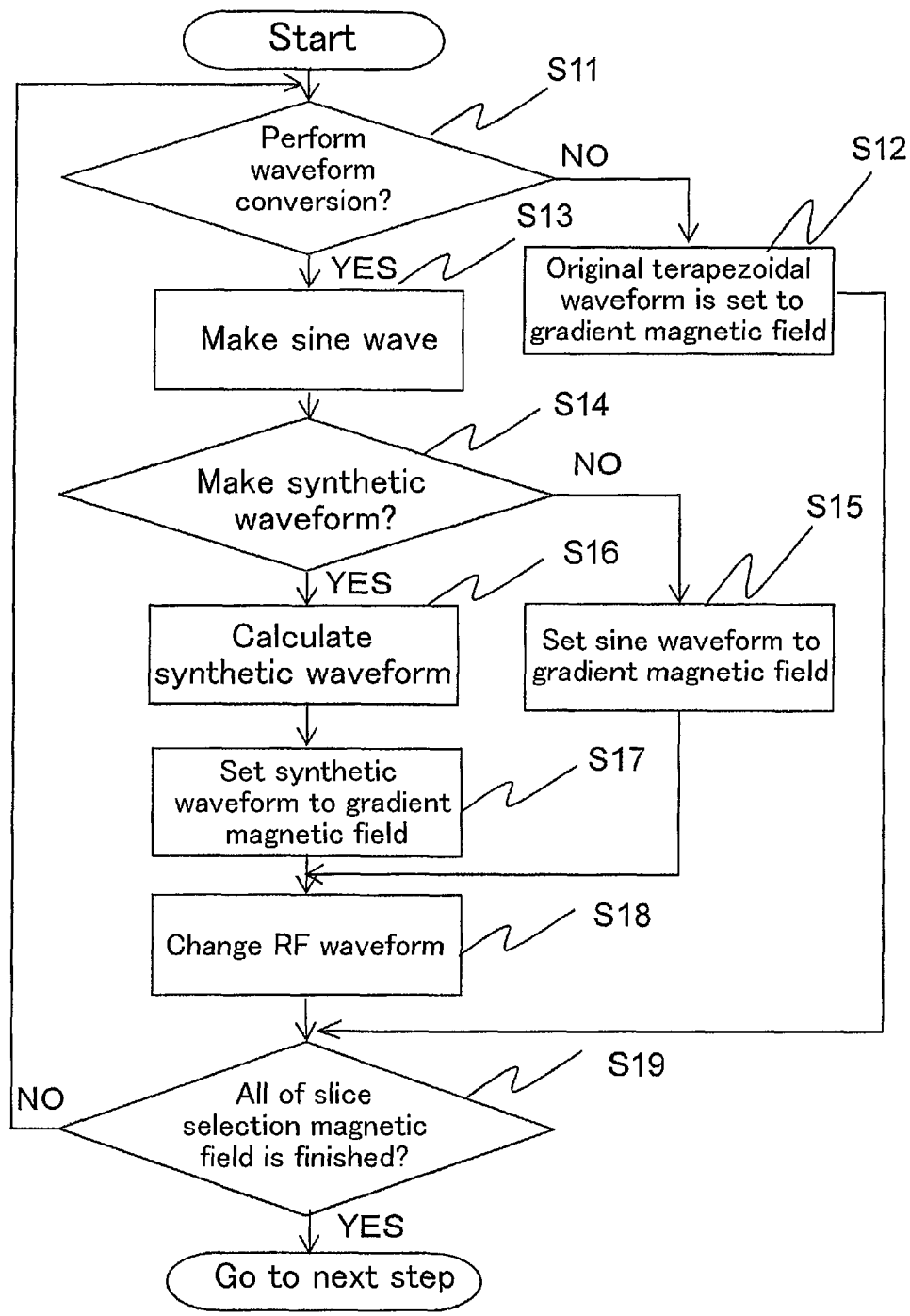
FIG. 11 shows an example of the flow of processing of converting waveform of gradient magnetic field pulse.

Further, when a readout gradient magnetic field pulse is converted into a pulse of a synthesized waveform, it is also possible to prepare a sine wave first, compare the maximum intensity thereof with that of the original trapezoidal readout gradient magnetic field pulse, and prepare the synthesized waveform according to the result of the comparison, as in the case of the slice gradient magnetic field pulse explained with reference to FIG. 11. That is, if conversion of a readout gradient magnetic field pulse into a pulse of a sine waveform significantly decreases the S/N ratio and thereby provides unacceptable degradation of image quality, a synthesized waveform is used.

The details of the waveform conversion processings shown in FIG. 4 have been explained above. These waveform conversion processings can be performed by functions of the computer 109 of the MRI apparatus as already described, but a pulse sequence in which waveform conversion has been performed beforehand by calculation in a computer separate from the MRI apparatus may be carried on the MRI apparatus.

<<Evaluation of Noises>>

Figure 15:
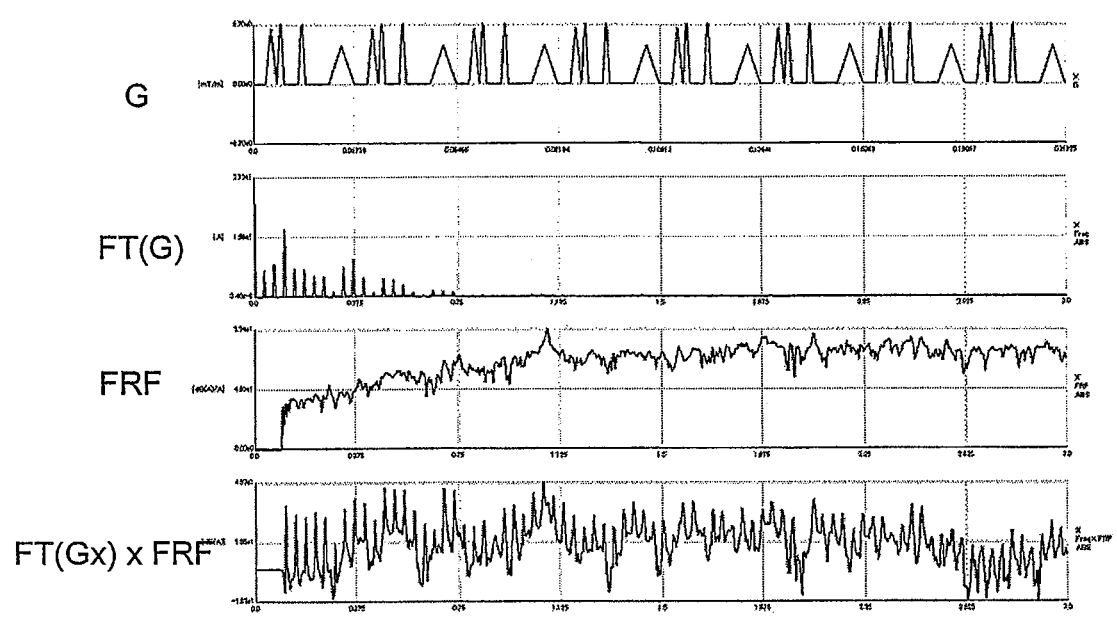
FIG. 15 is a drawing for explaining measurement for confirming the effect of the first embodiment.

In order to evaluate the silencing effect of this embodiment, equivalent noise level was estimated as follows. That is, the gradient magnetic field pulse waveform was subjected to the Fourier transform to obtain frequency distribution, and the equivalent noise level was calculated from the result of multiplication of the frequency distribution and the FRF of the A-weighting measured with the MRI apparatus. FRF is obtained by measuring noises generated by application of a white noise-type gradient magnetic field with a microphone, and subjecting the measured noises to frequency spectrum conversion. FIG. 15 shows a gradient magnetic field waveform G used for a pulse sequence, frequency distribution thereof FT(G), and measured FRF. The result of the multiplication of the frequency distribution and FRF of the gradient magnetic field (FT(Gx)×FRF) is shown in the lowest part of FIG. 15.

Figure 16:
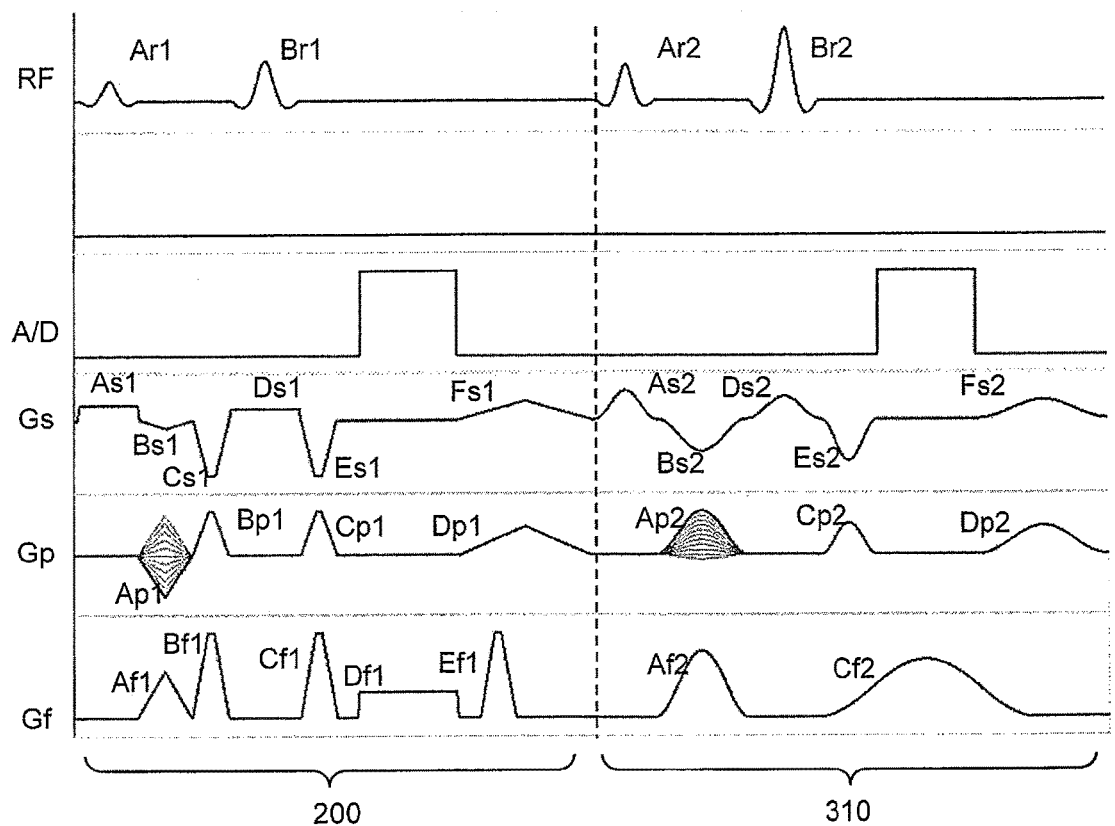
FIG. 16 is a drawing showing an example of conversion of the pulse sequence shown in FIG. 3.

As pulse sequences, the pulse sequence 200 shown in the left part of FIG. 3, the pulse sequence 300 shown in the right part of the same, and the pulse sequence 310 shown in the right part of FIG. 16 were evaluated. The pulse sequence 310 shown in the right part of FIG. 16 is obtained by conversion of the gradient magnetic field pulses of the pulse sequence 200 shown in the left part of FIG. 16 (the same as the pulse sequence 200 shown in FIG. 3) to those of a sine wave, not a synthesized wave.

As a result, the equivalent noise level of the original pulse sequence 200 using trapezoidal gradient magnetic field pulses was 78 dB. In contrast, the equivalent noise level of the pulse sequence 310 shown in FIG. 16, which had undergone the sine waveform conversion, was 59 dB. The sound pressure level could be reduced by 19 dB by converting the gradient magnetic field pulses into those of a sine waveform. Further, the equivalent noise level of the pulse sequence 300, in which the gradient magnetic field pulses applied during irradiation of RF pulses are converted into those of a synthesized sine waveform, was 61 dB. In this case, decrease of 17 dB could be realized as the noise reduction effect with substantially no elevation of SAR and no reduction of the SN ratio.

Second Embodiment

Figure 17:
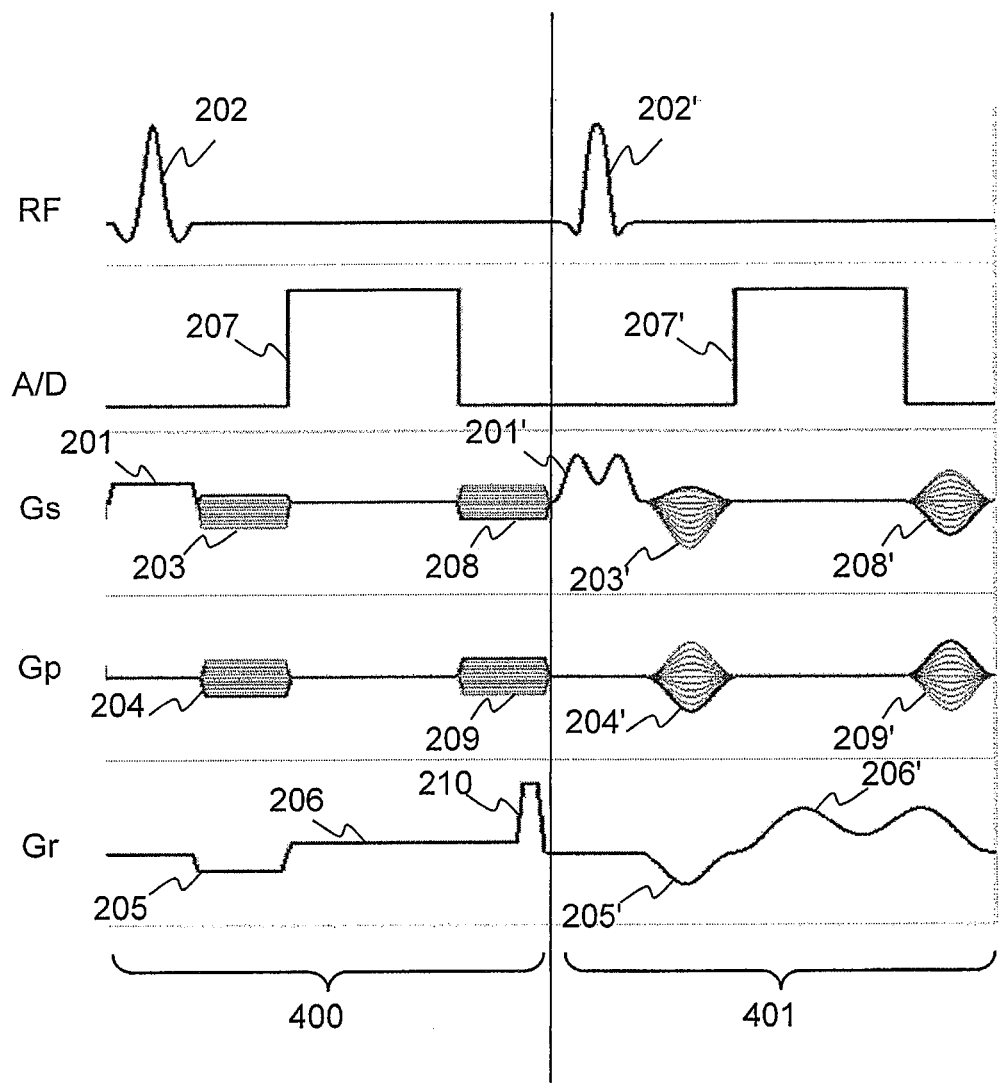
FIG. 17 is a drawing showing an example of the pulse sequence according to the second embodiment.
Figure 18:
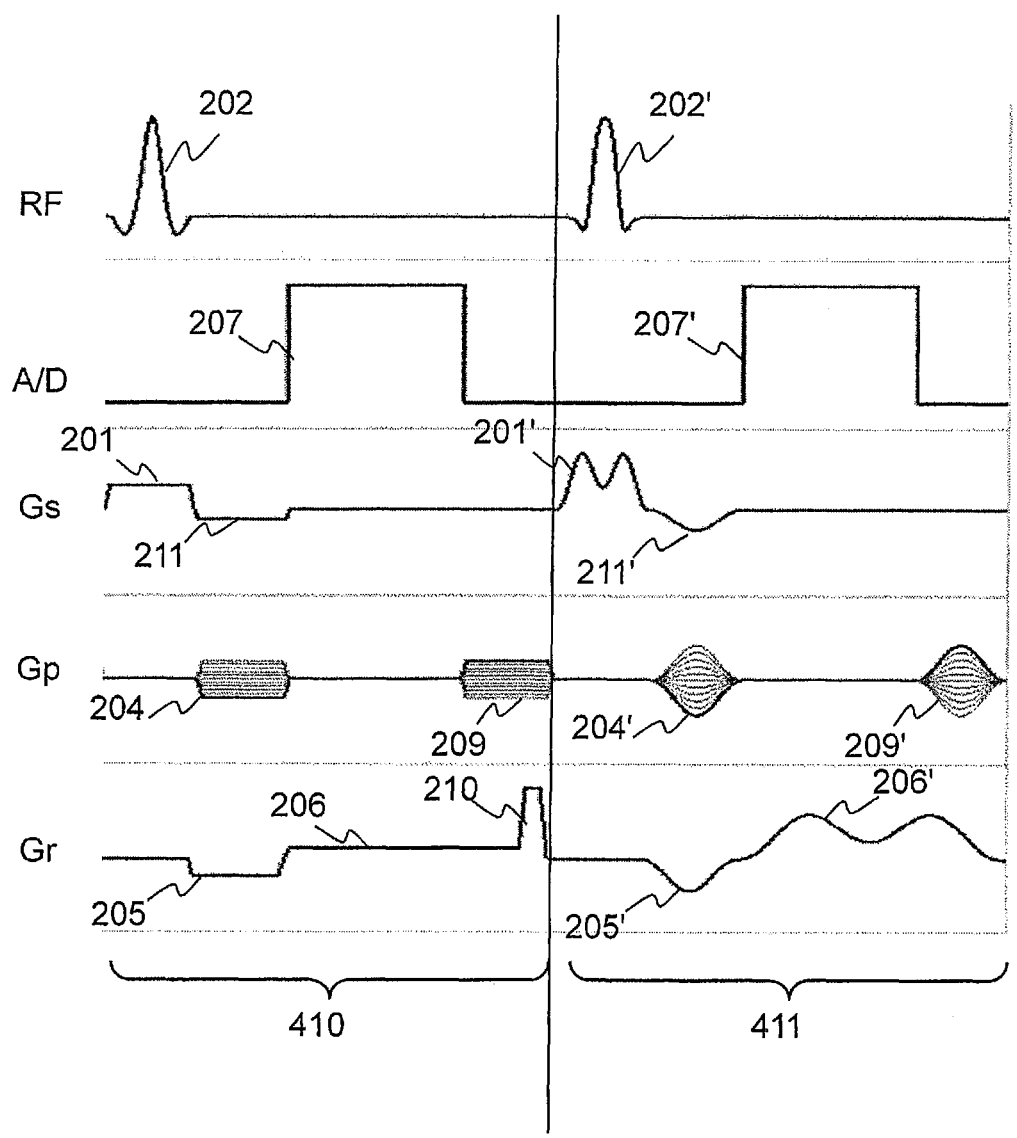
FIG. 18 is a drawing showing another example of the pulse sequence according to the second embodiment.

The first embodiment is an embodiment in which the present invention is applied to a 2D-SE sequence, but the present invention can also be applied to a pulse sequence other than 2D-SE sequence. This embodiment is an embodiment in which the present invention is applied to a gradient echo (GrE) sequence. The GE sequence may be applied to such a three-dimensional sequence (3D-GrE sequence) as shown in FIG. 17, and such a two-dimensional sequence (2D-GrE sequence) as shown in FIG. 18. Since 2D-GrE sequence (410, 411) and 3D-GrE sequence are substantially the same except that slice encoding included in 3D-GrE sequence is omitted in 2D-GrE sequence, a 3D-GrE sequence will be explained below.

FIG. 17 shows a 3D-GrE sequence 400 comprising trapezoidal waves in the left part, and a sequence 401 corresponding to the sequence 400 in which the trapezoidal waves are converted into sine waves in the right part. As the operation with the 3D-GrE sequence, a slice selection gradient magnetic field pulse 201 is applied first, and a radio frequency magnetic field (RF) pulse 202 is irradiated at the same time to excite magnetization of a certain slice in a subject. Then, there are applied a slice encoding gradient magnetic field pulse 203 and a phase encoding gradient magnetic field pulse 204, each of which is a pulse for imparting positional information to the phase of magnetization, and a readout gradient magnetic field 205 for dephasing. To the slice encoding gradient magnetic field pulse 203, a slice rephasing gradient magnetic field pulse is added. Then, a magnetic resonance signal (echo) is measured during the sampling time 207 of A/D with applying a readout gradient magnetic field pulse 206 for imparting positional information for the readout direction. Finally, pulses 208 and 209 for canceling slice encoding and phase encoding, respectively, are applied, and a crusher pulse 210 is applied for the r axis.

The above procedure is repeated with a repetition time TR with changing the intensities of the slice encoding gradient magnetic field pulse 203 and the phase encoding gradient magnetic field pulse 204 (amounts of slice encoding and phase encoding), echoes are measured.

The echoes are arranged in a three-dimensional k-space, and subjected to inverse Fourier transform to reconstruct an image. This pulse sequence is used for obtaining a T1-weighted image, usually with TR of several tens of milliseconds.

The pulse sequence 401 shown in the right part of FIG. 17 is a pulse sequence obtained as a result of conversion of the trapezoidal waveforms of the pulse sequence into sine waveforms. The slice gradient magnetic field pulse 201 is converted into a slice gradient magnetic field pulse 201' of a synthesized sine waveform created in the same manner as that used for the synthesized sine wave As3 shown in FIG. 7, and the readout gradient magnetic field pulse 206 and the crusher gradient magnetic field pulse 210 are together converted into a readout gradient magnetic field pulse 206' of a synthesized sine waveform created in the same manner as that used for the synthesized sine wave Cf3 shown in FIG. 13 (b). The other pulses are converted into those of sine waveforms of the same start and end times of application, and the same areas (for example, the sine wave shown in FIG. 6 (a)). Further, corresponding to the conversion of waveform of the gradient magnetic field pulse 201, RF pulse 202 is changed as shown in FIG. 9 (a).

Noise evaluation using FRF was also performed for this 3D-GrE sequence and the 2D-GrE sequence in the same manner as that used in the first embodiment. As a result, for both pulse sequences, the sound pressure level was 83 dB before the conversion of the gradient magnetic field pulse waveform, whereas it became 71 dB after the conversion, and thus silencing effect of 12 dB was obtained. It was thereby confirmed that the sound pressure level could be reduced also by this embodiment with suppressing increase of SAR and decrease of the S/N ratio, like the first embodiment.

Embodiments of the present invention have been explained above, and for these embodiments, there have been explained examples in which gradient magnetic field pulses of a synthesized waveform are used for both the slice gradient magnetic field pulse and the readout gradient magnetic field pulse. However, use of a pulse sequence in which a gradient magnetic field pulse of a synthesized waveform is used for either one of the slice gradient magnetic field pulse and the readout gradient magnetic field pulse also fall within the scope of the present invention. Further, although there have been explained examples in which the gradient magnetic field pulses other than the gradient magnetic field pulses of a synthesized waveform are those of a sine wave, a pulse sequence including a gradient magnetic field pulse of a trapezoidal or triangular waveform as a part of the pulses also fall within the scope of the present invention.

According to the present invention, more silent apparatuses can be realized with maintaining high degree of freedom for design of pulse sequence. Further, according to the present invention, increase of SAR and decrease of S/N ratio due to change of the gradient magnetic field pulse waveform can be suppressed.

The invention claimed is:

1. A magnetic resonance imaging apparatus comprising:
    a static magnetic field magnet that generates a static magnetic field;
    a gradient coil that generates a gradient magnetic field in the static magnetic field generated by the static magnetic field magnet;
    a radio frequency coil that generates a radio frequency magnetic field and receives a magnetic resonance signal; and
    a controller configured to drive the gradient coil and the radio frequency coil according to a pulse sequence including a plurality of gradient magnetic field pulses,
    wherein the pulse sequence corresponds to a predetermined base sequence including a plurality of base pulses,
    wherein the controller is further configured to respectively use a synthesized gradient magnetic field pulse synthesized from two or more predetermined base waves which are each unipolar, convex waveforms for each of one or more of the gradient magnetic field pulses included in the pulse sequence.

2. The magnetic resonance imaging apparatus according to claim 1, wherein:
    the controller is further configured to respectively synthesize each of the one or more of the gradient magnetic field pulses included in the pulse sequence from the two or more predetermined base.

3. The according to claim 1, wherein:
    the one or more synthesized gradient magnetic field pulses are slice selection gradient magnetic field pulses.

4. The magnetic resonance imaging apparatus according to claim 3, wherein:
    the controller is configured to change a radio frequency magnetic field pulse generated by the radio frequency coil in accordance with the slice selection gradient magnetic field pulses.

5. The magnetic resonance imaging apparatus according to claim 1, wherein:
    the one or more synthesized gradient magnetic field pulses are encoding gradient magnetic field pulses.

6. The magnetic resonance imaging apparatus according to claim 1, wherein:
    the one or more synthesized gradient magnetic field pulses are readout gradient magnetic field pulses.

7. The magnetic resonance imaging apparatus according to claim 1, wherein:
    one or more of the base pulses are triangular or trapezoidal gradient magnetic field pulses, and
    an intensity around a center of each of the one or more synthesized gradient magnetic field pulses is less than or equal to an intensity of the triangular or trapezoidal gradient magnetic field pulses.

8. The magnetic resonance imaging apparatus according to claim 1, wherein:
    each of the base waves is unipolar.

9. The magnetic resonance imaging apparatus according to claim 1, wherein:
    each of the base waves is a Gaussian function.

10. A method for reducing noise in a magnetic resonance imaging apparatus which is driven by a pulse sequence including a plurality of gradient magnetic field pulses, and the pulse sequence corresponds to a predetermined base sequence including a plurality of base pulses, the method comprising:
    calculating a first slice selection gradient magnetic field pulse from a base wave which is a unipolar, convex, sine waveform corresponding to one of the base pulses;
    calculating a radio frequency magnetic field pulse to be applied simultaneously with the first slice selection gradient magnetic field pulse;
    judging whether a specific absorption rate (SAR) of the calculated radio frequency magnetic field pulse is less than or equal to a threshold value;
    when the specific absorption rate is less than or equal to the threshold value, setting the calculated first slice selection gradient magnetic field pulse as one of the slice gradient magnetic field pulses of the pulse sequence; and
    when the specific absorption rate is greater than the threshold value, synthesizing a second slice selection gradient magnetic field pulse from two or more predetermined base waves which are each unipolar, convex waveforms corresponding to two or more of the base pulses, and setting the synthesized second gradient magnetic field pulse as the one of the slice gradient magnetic field pulses of the pulse sequence; storing the pulse sequence in a nonvolatile storage medium; and
    driving the magnetic resonance imaging apparatus using the pulse sequence.

11. A method for reducing noise in a magnetic resonance imaging apparatus which is driven by a pulse sequence including a plurality of gradient magnetic field pulses, and the pulse sequence corresponds to a predetermined base sequence including a plurality of base pulses, the method comprising:

calculating one of the gradient magnetic field pulses of the pulse sequence by synthesizing the one of the gradient magnetic field pulses from two or more predetermined base waves which are each unipolar, convex waveforms corresponding to two or more of the base pulses included in the base sequence, wherein a starting time point and an end time point of the synthesized gradient magnetic field pulse are substantially the same as a starting time point and end time point of the two or more of the base pulses included in the base sequence, and wherein an area of the synthesized gradient magnetic field pulse is substantially the same as an area of the two or more of the base pulses included in the base sequence;

storing the pulse sequence in a nonvolatile storage medium; and driving the magnetic resonance imaging apparatus using the pulse sequence which includes the synthesized gradient magnetic field pulse.

12. The method according to claim 11, further comprising:

determining whether the synthesized gradient magnetic field pulse is calculated or not according to an application time of each of the two or more of the base pulses included in the base sequence.

13. The method according to claim 12, wherein:

when the application time is 2 ms or longer, the synthesized gradient magnetic field pulse is calculated.

14. The magnetic resonance imaging apparatus according to claim 1, wherein:

the controller is configured to determine whether to synthesize each of the one or more gradient magnetic field pulses according to an application time of the corresponding two or more of the base pulses included in the base sequence.

15. The magnetic resonance imaging apparatus according to claim 14, wherein:

the application time is 2 ms or longer.

16. The magnetic resonance imaging apparatus according to claim 1, further comprising:

a receiver that detects one or more echo signals in the received magnetic resonance signal; and a computer programmed to arrange the echo signals in a k-space, and reconstruct an image therefrom.

* * * * *